United States Patent [19]
Tanaka et al.

[11] Patent Number: 5,394,372
[45] Date of Patent: Feb. 28, 1995

[54] SEMICONDUCTOR MEMORY DEVICE HAVING CHARGE-PUMP SYSTEM WITH IMPROVED OSCILLATION MEANS

[75] Inventors: Tomoharu Tanaka; Riichiro Shirota, both of Kanagawa, Japan

[73] Assignee: Kabushiki Kaisha Toshiba, Kawasaki, Japan

[21] Appl. No.: 37,585

[22] Filed: Mar. 26, 1993

[30] Foreign Application Priority Data

May 19, 1992 [JP] Japan ................................. 4-426002

[51] Int. Cl.$^6$ ................................................. G11C 7/00
[52] U.S. Cl. ........................... 365/226; 365/189.09; 327/538; 327/536
[58] Field of Search ...................... 365/189.09, 189.11, 365/226, 185, 218; 307/296.2, 296.8, 296.6, 296.1, 296.3, 296.6; 331/57

[56] References Cited

U.S. PATENT DOCUMENTS

| | | | |
|---|---|---|---|
| 4,471,290 | 9/1984 | Yamaguchi | 307/296.2 X |
| 5,058,063 | 10/1991 | Wada et al. | 365/185 |
| 5,172,342 | 12/1992 | Gochi | 365/226 |
| 5,182,529 | 1/1993 | Chern | 331/57 |
| 5,193,198 | 3/1993 | Yokouchi | 365/226 X |
| 5,227,675 | 7/1993 | Taguchi | 307/296.1 |
| 5,267,218 | 11/1993 | Elbert | 365/226 |

FOREIGN PATENT DOCUMENTS 3154299 7/1991 Japan .

Primary Examiner—Eugene R. LaRoche
Assistant Examiner—Son Mai
Attorney, Agent, or Firm—Oblon, Spivak, McClelland, Maier & Neustadt

[57] ABSTRACT

A charge-pump system with an improved oscillation circuit. An electrically programmable non-volatile semiconductor memory device having the charge-pump system with the improved oscillation circuit includes a memory system equipped with a memory circuit having a non-volatile memory function, a oscillating circuit for generating an signal having a frequency which is increased in response to a decrease of a power supply voltage, and a charge-pump circuit which generates a voltage required to write data into or erase data from memory by charge-pumping the power supply voltage according to the signal generated by the oscillating circuit. A ring oscillator serves as the oscillating circuit and the ring oscillator is constituted of a group of inverter circuits connected circularly to one another via a MOS transistor which serves to transfer an electric charge, a gate electrode of the MOS transistor being connected to an output terminal of a voltage converting circuit which increases a transfer capacity of the MOS transistor as the power supply voltage decreases.

13 Claims, 11 Drawing Sheets

SEMICONDUCTOR MEMORY DEVICE HAVING CHARGE-PUMP SYSTEM WITH IMPROVED OSCILLATION MEANS

BACKGROUND OF THE INVENTION

1. Field of the Invention

The present invention relates to an electrically reprogrammable non-volatile semiconductor memory device or electrically erasable programmable read-only memory (EEPROM), and particularly relates to the non-volatile semiconductor memory device which includes therein a charge-pump circuit for generating a high voltage necessary for a write/erase operation of the memory device and can be operated by a single power source.

2. Description of the Related Art

As an example of an EEPROM which is capable of performing write/erase using a single power source, for instance, Vcc=5 V, there is known a NAND type EEPROM. The NAND type EEPROM has a plurality of memory cells which commonly share a source and drain neighboring to each other and are arrayed in series so as to form a unit thereof and connected to a bit line through a selection transistor provided between the bit line and the NAND unit. In general, the memory cell has a FETMOS (Field Effect Transistor Metal-Oxide-Semiconductor) structure. The memory cell is, for example, an n channel type and the memory cell array is integrated in a p type well formed on an n type substrate or a p type substrate.

In the EEPROM such as a NAND type EEPROM, a voltage higher than a power supply voltage is usually applied at the time of write/erase operation so that a charge level of a charge storage layer is controlled by a tunnel current or a hot electron injection so as to store data.

For example, a write/erase of data for the above-mentioned NAND type EEPROM is operated as follows. Data writing is performed in the order from the memory cell farthest from the bit line. A high voltage Vpp of, for instance, approximately 20V is applied to a control gate of a selected memory cell, an intermediate potential VppM of, for instance, approximately 10V is applied to a gate of the selection transistor and the control gate of a memory cell located further in the bit line side, and a 0V or the intermediate potential is applied to the bit line in accordance with the data to be stored. When the 0V is applied to the bit line, the potential is transferred to a drain of the selected memory cell, so that an electron injection or tunnel phenomenon occurs from the drain into a floating gate. Thereby, a threshold of the selected memory cell is shifted to a positive direction. Such state is denoted as "1", for instance. When the intermediate potential is applied to the bit line, there will not be caused the electron injection or the tunnel phenomenon. Therefore, the threshold of the selected memory cell is not shifted and remains negative. This state is denoted as "0". Data erasing is carried out simultaneously against entire memory cells in the NAND cell. In other words, all of control gates and selection gates are set to 0V and the bit line as well as the source line are set to a floating state, and a high voltage of, for instance, 20V is applied to the p type well on the p type substrate. Consequently, electrons of the floating gate in every memory cell are discharged into the p type well or the p type substrate. Accordingly, the threshold of every memory cell is shifted to a negative direction.

As described above, even in an EEPROM operated by a single power source, it is generally necessary to generate a voltage, such as Vpp, higher than the power supply voltage. Therefore, the high voltage is conventionally generated using a charge-pump circuit. However, a current supply capacity of the charge-pump circuit generally declines as the power supply voltage decreases. The charge-pump circuit is usually driven by a ring oscillator. An oscillating frequency of the ring oscillator also declines as the power supply voltage decreases. As a result, referring to FIG. 1, in the charge-pump circuit which is designed to operate by a minimum power supply voltage, the charge-pump circuit has a current supply capacity which is well beyond the necessary capacity in case of a maximum power supply voltage value.

Thus, there has been a problem where a power supply has been unnecessarily wasted due to fluctuation of current supply capacity of the charge-pump circuit caused by the fluctuation of the power supply voltage at the time of write/erase.

SUMMARY OF THE INVENTION

In view of the foregoing problem, it is therefore an object of the present invention to provide a non-volatile semiconductor memory device having a charge-pump circuit with an improved oscillating means, where the capacity of the charge-pump circuit does not depend on fluctuation of a power supply voltage, so that the power consumed at the time of write/erase will not be minimal.

To achieve this object, there is provided an electrically programmable non-volatile semiconductor memory device comprising: a memory system equipped with memory means having a non-volatile memory function; an oscillating circuit for generating a signal having a frequency which is increased in response to a decrease of a power supply voltage; and a charge-pump circuit which generates a voltage required to write data into or erase data from the memory means by charge-pumping the power supply voltage in accordance with the signal generated by the oscillating circuit.

Other features and advantages of the present invention will become apparent from the following description taken in conjunction with the accompanying drawings.

DETAILED DESCRIPTION OF THE PREFERRED EMBODIMENTS

Features of the present invention will become apparent in the course of the following description of exemplary embodiments which are given for illustration of the invention and are not intended to be limiting thereof. Embodiments of the present invention will now be described with reference to the drawings.

Figure 1:
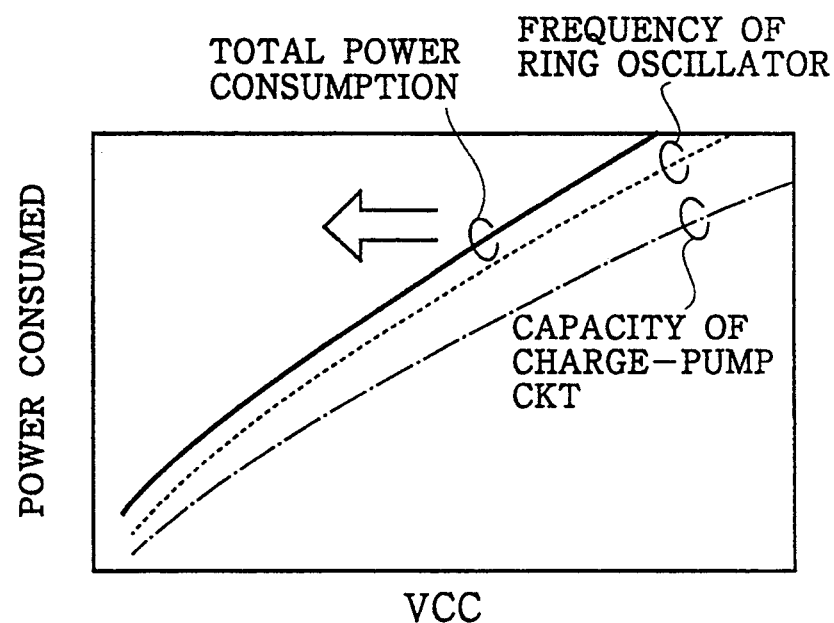
FIG. 1 is a graph showing a relationship between power consumption and supply voltage Vcc according to the conventional device.
Figure 2:
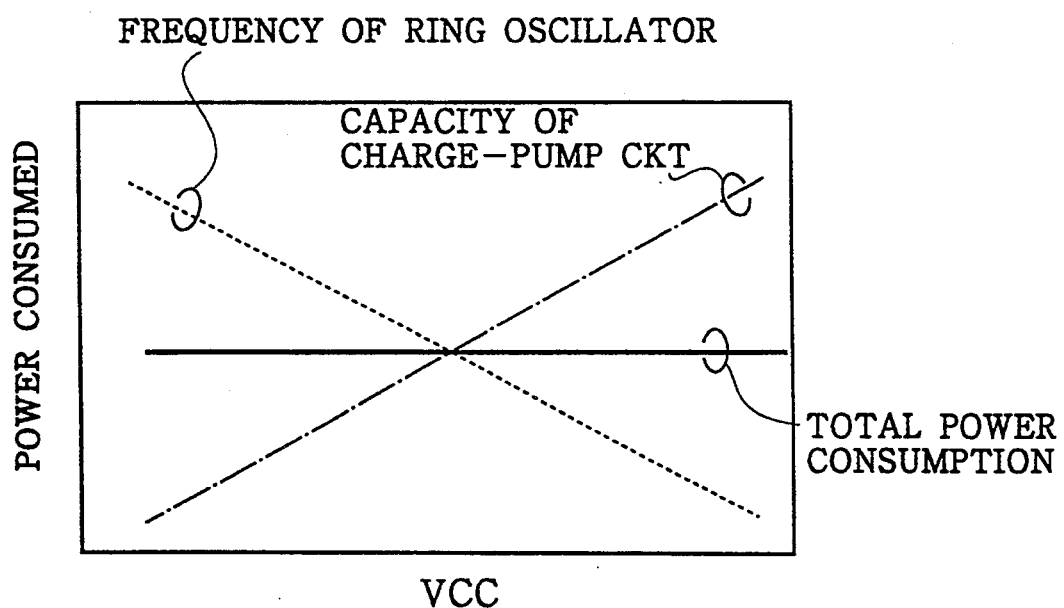
FIG. 2 is a graph showing a relationship between the power consumption and the supply voltage Vcc according to the present invention.

In order to show a feature of a semiconductor memory device achieved by the present invention, FIG. 1 showing the prior art is brought to attention herewith. In FIG. 1, a capacity of a charge-pump circuit including a rise-up time thereof and a frequency of a ring oscillator increase proportionally with a power supply voltage Vcc. Thus, a power consumed increases in accordance with an increase of the power supply voltage.

On the other hand, according to the present invention, the frequency of the ring oscillator is designed to decrease as the power supply voltage Vcc increases. Therefore, a total power consumption remains constant regardless of a level of the supply voltage Vcc.

Figure 3:
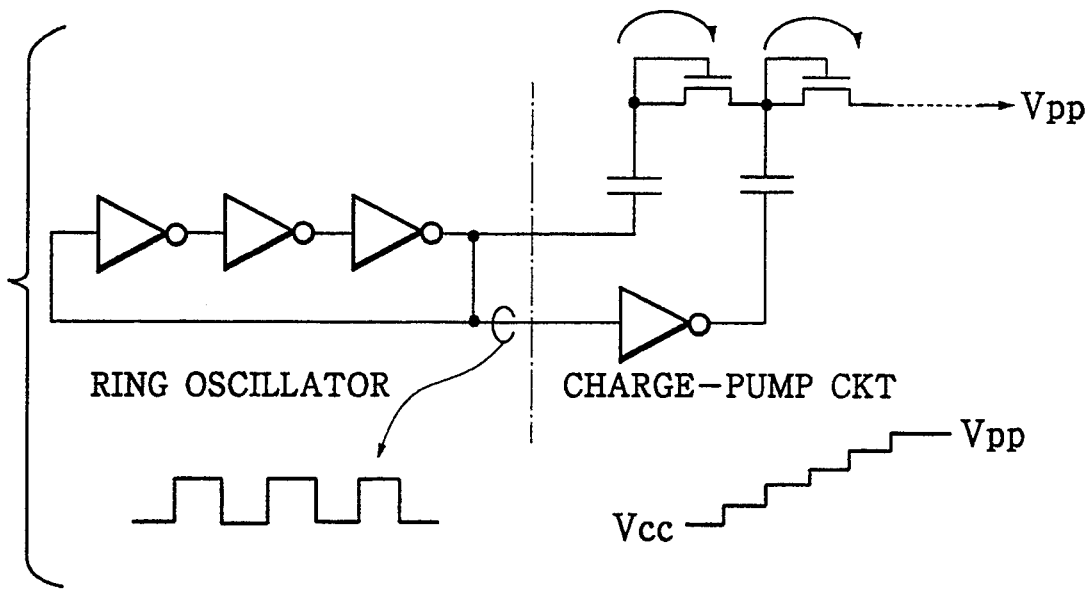
FIG. 3 shows a conventional circuit which comprises a ring oscillator and a charge-pump circuit, combined in a conventional manner.

FIG. 3 shows a structural example of the conventional charge-pump circuit and the conventional ring oscillator, where a charge-pump capacity increases as the oscillating frequency of the ring oscillator increases. Therefore, a power consumed also increases.

Figure 4:
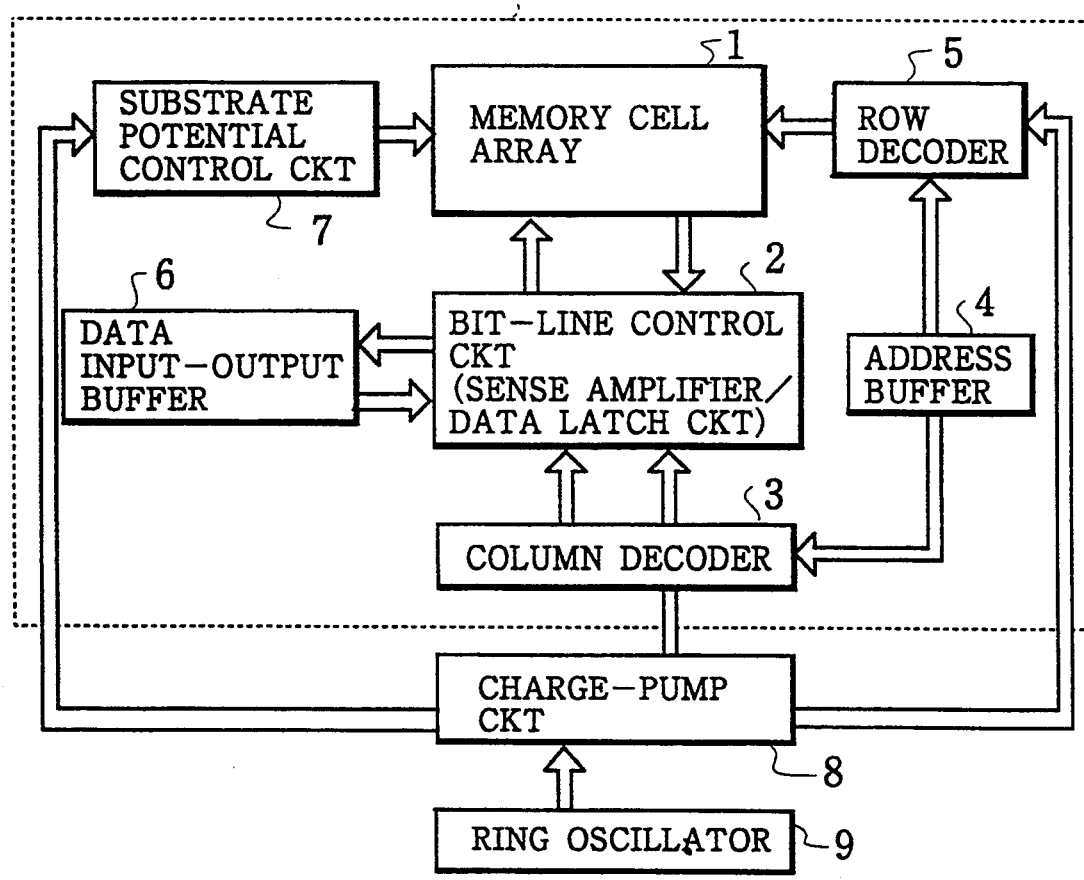
FIG. 4 shows a block diagram of a first embodiment of the present invention for a non-volatile semiconductor memory device utilizing a NAND type EEPROM.

FIG. 4 shows a block diagram of the first embodiment of the present invention for a non-volatile semiconductor memory device utilizing a NAND type EEPROM. In the same figure, data is written into a memory cell array 1 serving as memory means, and there is provided a bit line control circuit 2, connected to the memory cell array 1, for writing the data or reading out the data. The bit line control circuit 2 is connected to a data input-output buffer 6, and receives an output of a column decoder 3 receiving an address signal from an address buffer 4. There is provided a row decoder 5, connected to the memory cell array 1, for controlling a control gate and a selection gate. There is also provided a substrate potential control circuit 7, connected to the memory cell array 1, for controlling a potential of a p type substrate or a p type well on which the memory cell array is formed. A memory system 10 comprises the memory cell array 1 and circuits controlling each function of memory cell array 1. A charge-pump circuit 8 receives a drive signal from a ring oscillator 9 circuit and then supplies a high voltage, which is charge-pumped from a power supply voltage, to the bit line control circuit 2, the row decoder 5 and the substrate potential control circuit 7 at the operation of write/erase of the memory cell array 1.

Figure 5A:
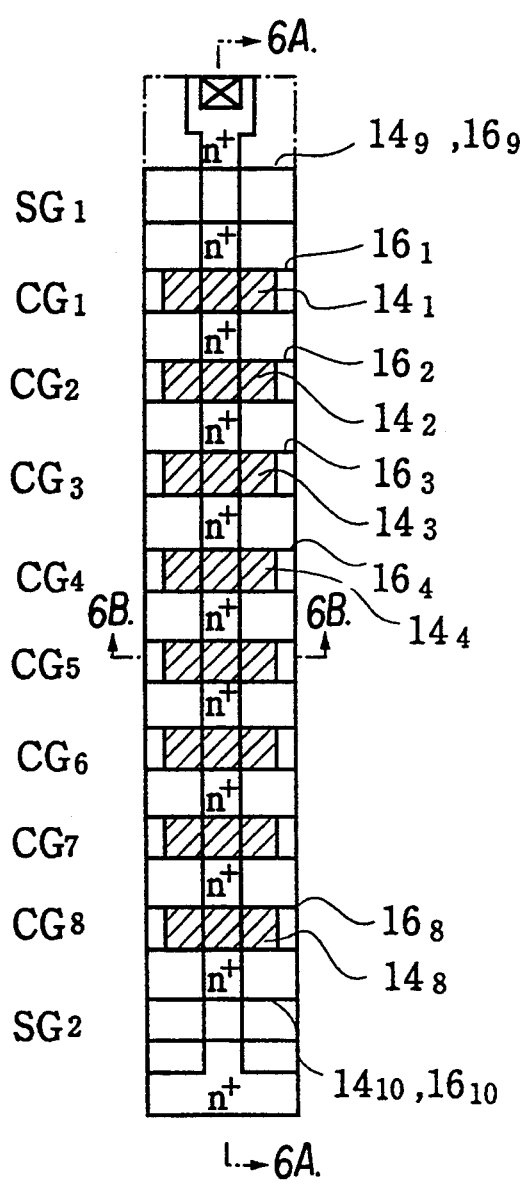
FIG. 5A and FIG. 5B show a plan view of a NAND cell portion in the memory cell array 1 and an equivalent circuit thereof, respectively.
Figure 5B:
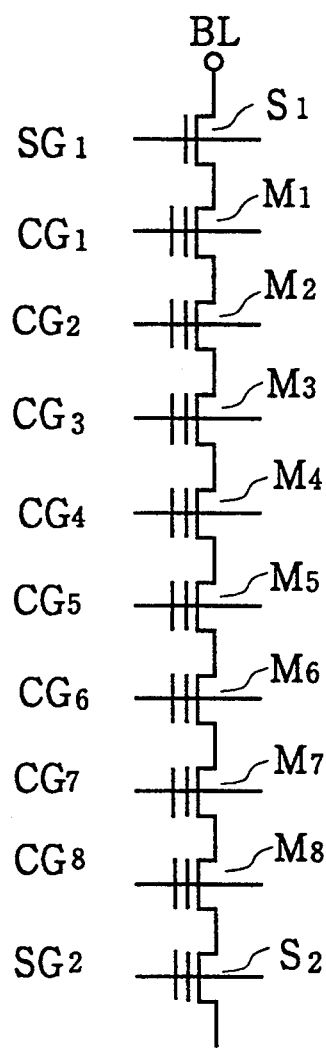

FIG. 5A and FIG. 5B show a plan view of a NAND cell portion in the memory cell array 1 and an equivalent circuit thereof, respectively.

Figure 6A:
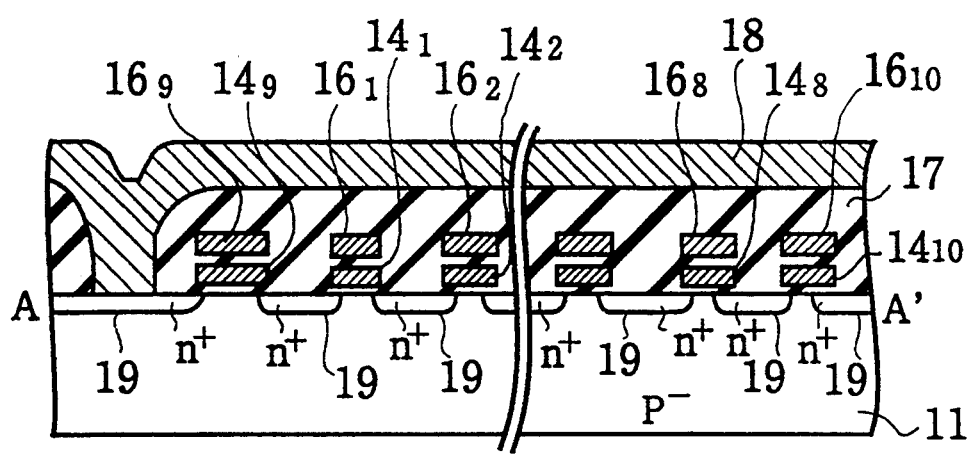
FIG. 6A and FIG. 6B show cross sections of FIG. 5A taken along lines A-A' and B-B', respectively.
Figure 6B:
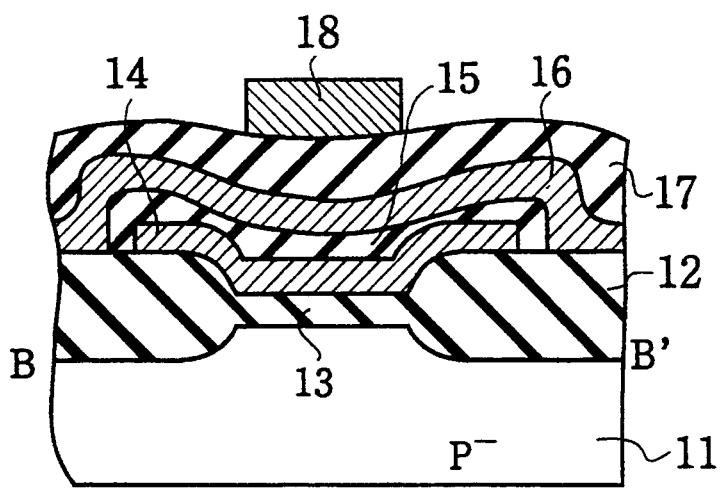

FIG. 6A and FIG. 6B show cross sections of FIG. 5A taken along lines A–A' and B–B', respectively. The memory cell array 1 comprising a plurality of NAND cells is formed on a p type silicon substrate 11 or a p type well enclosed by a device isolation thick oxide film 12, which isolates adjacent memory cell arrays each other. In this embodiment, eight memory cells M1 through M8 connected in series constitute a NAND cell. In each memory cell, there are formed floating gates 14 ($14_1$ through $14_8$) over the substrate 11 via gate insulating film 13, and on the floating gate 14 there are formed control gates 16 ($16_1$ through $16_8$) via layer insulating film 15. An n type diffusion layer 19 which serves as a source or drain of these memory cells is commonly used for a neighboring memory cell so that the memory cell is connected in series.

There are formed selection gates $14_9$, $16_9$ of selection transistor $S_1$ and selection gates $14_{10}$, $16_{10}$ in a drain side and a source side of the NAND cell, respectively; those selection gates are formed simultaneously with the formation of floating gate and the control gate of the memory cell. The substrate 11 where the memory cells are formed is covered by a CVD oxide film, and there is formed a bit line 18 on the substrate 11. The bit line 18 is in contact with a drain-side diffusion layer 19 which lies neighboring to an end of the NAND cell. The control gates 16 of the NAND cell units lying in the same column direction of row are commonly connected by control gate lines CG1 through CGS, respectively. Theses control gate lines CGi (i=1 through 8) functions as word lines. Similarly, the selection gates $14_9$, $16_9$ and $14_{10}$, $16_{10}$ are respectively arranged so as to be connected to selection gate lines SG1, SG2. In other words, the control gates 16 of memory cell transistors M along the column direction are connected together by control gate layer CGi (i=1 through 8) as shown in FIG. 6B.

Figure 7:
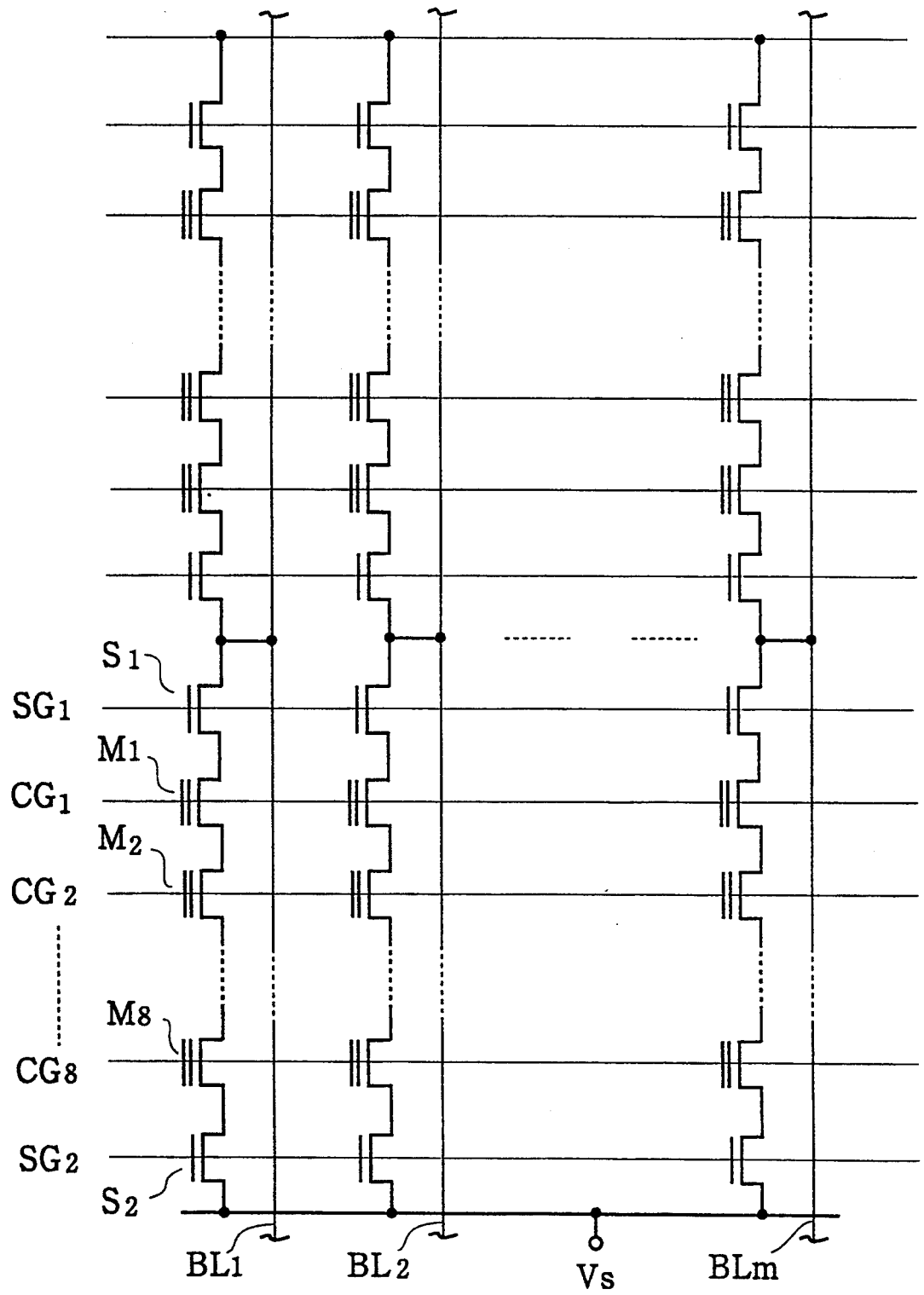
FIG. 7 shows an equivalent circuit of a memory cell array 1 of the NAND type EEPROM, arranged in a matrix.

FIG. 7 shows an equivalent circuit of a memory cell array 1 where these NAND cells are arranged in a matrix.

Figure 8:
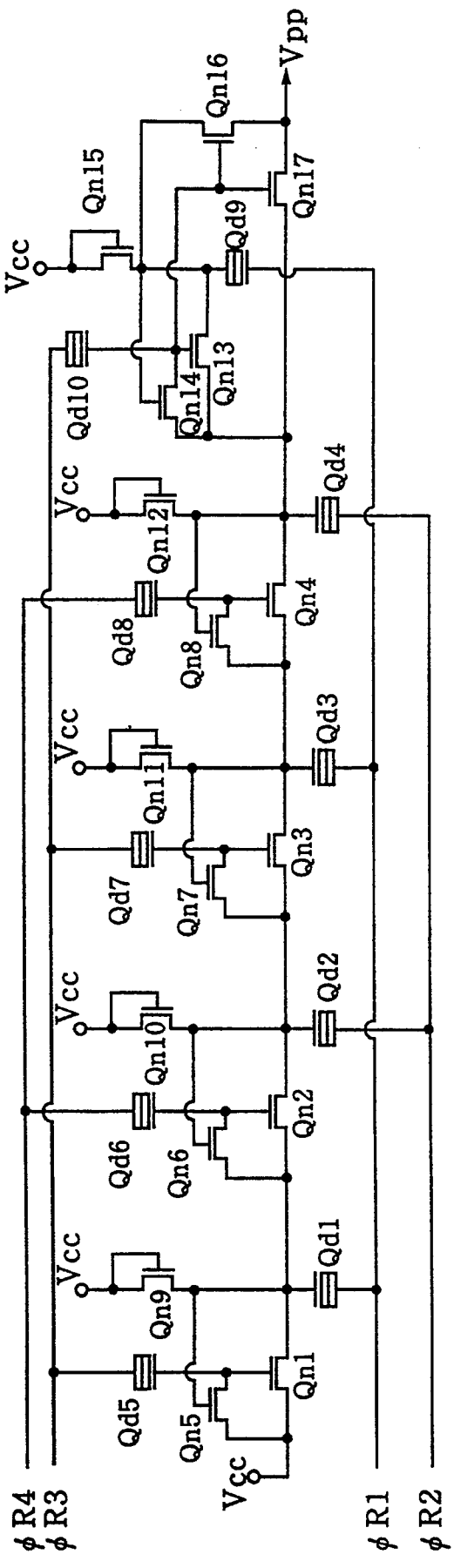
FIG. 8 shows a basic structure of the charge-pump circuit 8 shown in FIG. 4.

FIG. 8 shows a basic structure of the charge-pump circuit 8 shown in FIG. 4.

Figure 9:
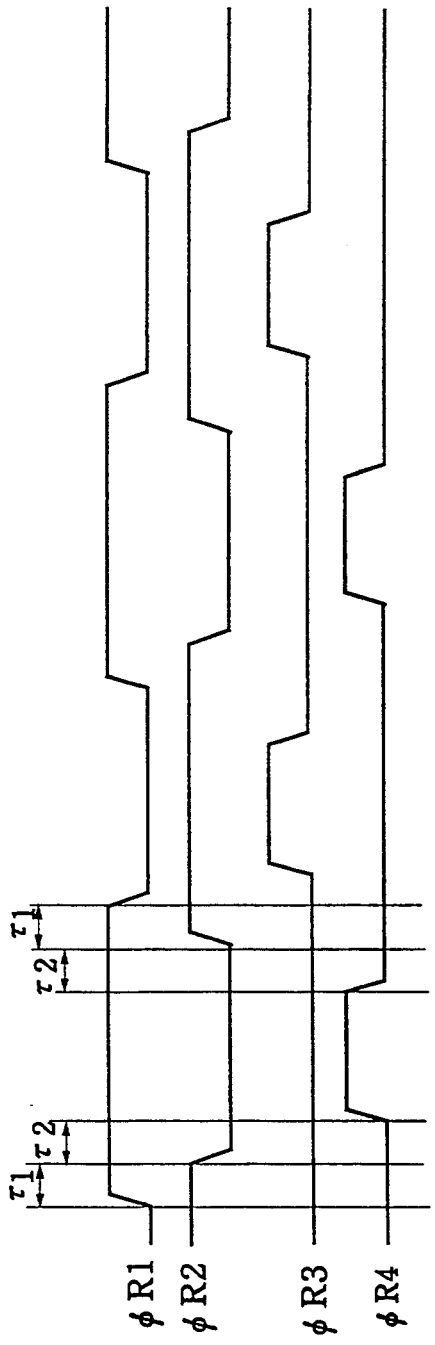
FIG. 9 shows a timing chart of output signals of the ring oscillator 9 and that the signals become drive signals $\phi R1$, $\phi R2$, $\phi R3$, $\phi R4$ of the charge-pump circuit 8.

FIG. 9 shows output signals of the ring oscillator 9 that become drive signals $\phi R1$, $\phi R2$, $\phi R3$, $\phi R4$ of the charge-pump circuit 8.

In order to raise a voltage, there are used D type n-channel MOS transistors QD1 through QD4 as capacitors, and there are used E type n-channel MOS transistors Qn1 through Qn4 and Qn17 as transfer gates. In order not to cause a voltage drop due to a threshold voltage by lifting up a gate voltage of transfer gates Qn1 through Qn4, there are provided D type n-channel MOS transistors QD5 through QD8 as capacitors and E type n-channel MOS transistors Qn5 through Qn8 as transfer transistors. Moreover, in order to prevent a voltage drop due to a threshold voltage by lifting up a source vovltage of a transfer gate Qn17, there are provided E type n-channel MOS transistors Qn13, Qn14 and D type n-channel MOS transistors Qd9, Qd10. There is provided E type n-channel MOS transistor Qn16 in order to equalize a gate electrode of Qn14 with an output voltage Vpp. Portions constituted by these MOS transistors such as Qn13, Qn14, Qn15, Qd9 and Qd10 operate as a dummy charge-pump steps. It shall be appreciated that the number of steps can be adjusted on demand.

Capacitors Qd1, Qd3 are charged by the supply voltage Vcc when $\phi R1$ becomes "L". When $\phi R1$ becomes "H", electric charges of capacitors QD1, QD3 are respectively transferred to capacitors Qd6, Qd8 to be charged through transfer gates Qn6, Qn8 so as to lift up gate voltage of the transfer gates Qn2, Qn4. Under these conditions, when $\phi R2$ and $\phi R4$ become "L" and "H", respectively, electric charges of capacitors Qd1, Qd3 are transferred to capacitors Qd2, Qd4 to be charged up through transfer gates Qn2, Qn4. By repeating such operation, the lifted-up voltage Vpp is generated such that the supply voltage Vcc is charge-pumped up to a predetermined voltage. Though a charge-pumping capacity of the charge-pump circuit 8 tends to decline as the supply voltage Vcc decreases, this declining trend is getting overcome as the frequencies of drive signals $\phi R1$, $\phi R2$, $\phi R3$ and $\phi R4$ increase.

Figure 10:
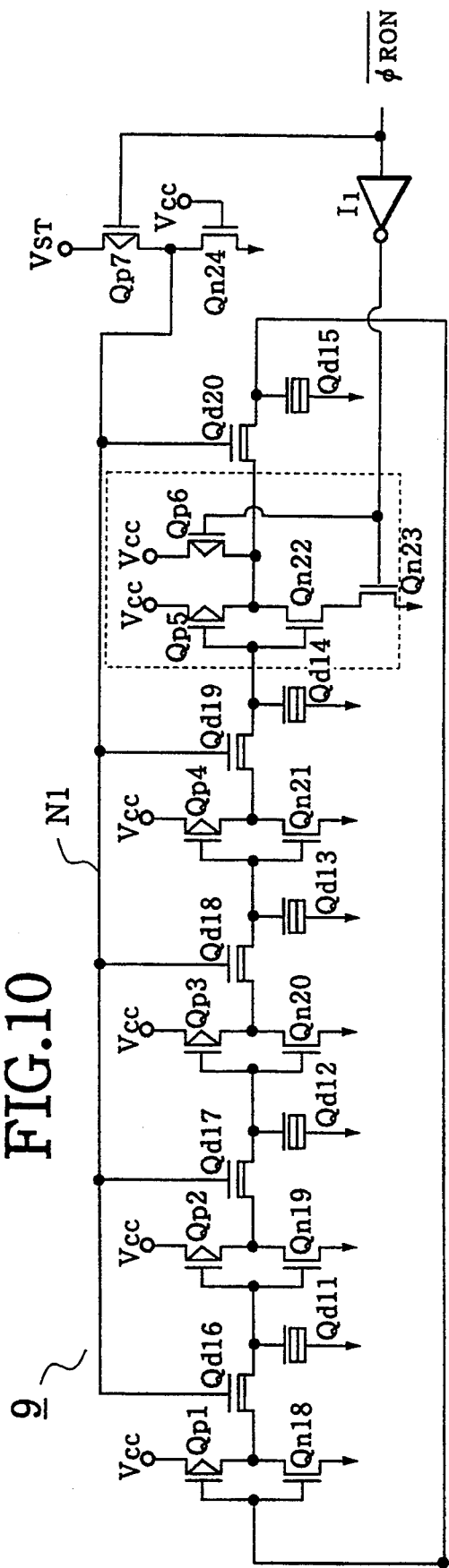
FIG. 10 shows a first structural example of the ring oscillator 9 shown in FIG. 4.
Figure 10:
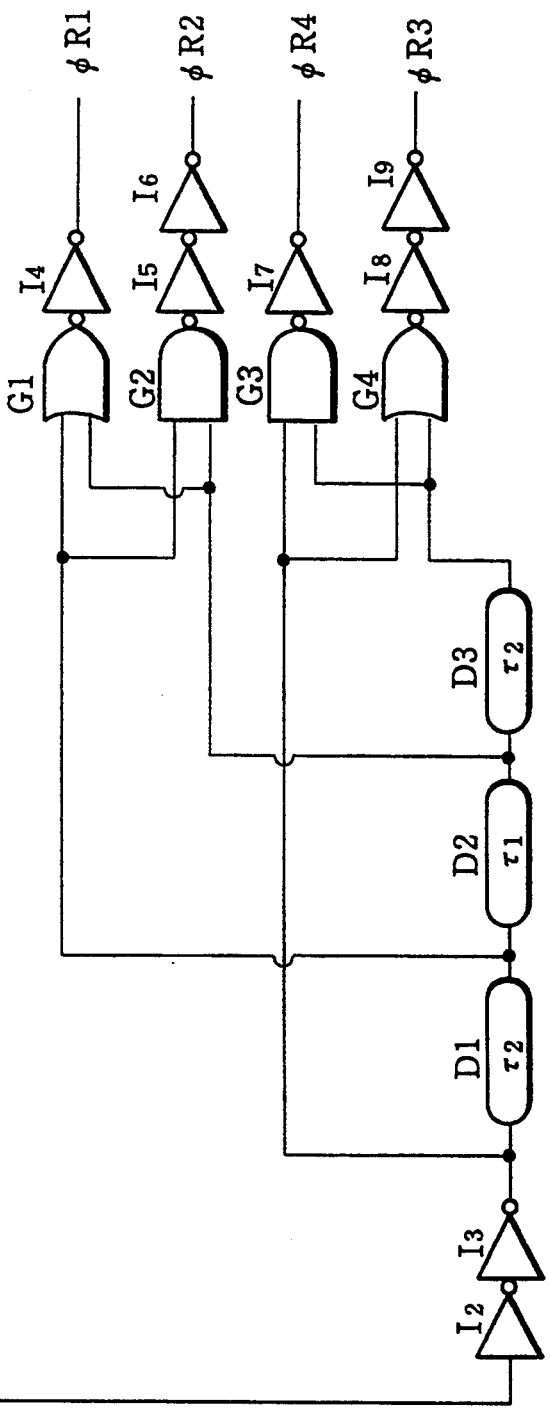

FIG. 10 shows a first structural example of the ring oscillator 9 shown in FIG. 4. E type n-channel MOS transistors Qn18 through Qn21 and E type p-channel MOS transistors Qp1 through Qp4 are connected to gate electrodes and drains, respectively so as to constitute inverter circuits. Qn22, Qn23, Qp5 and Qp6 constitute NAND circuits. D type n-channel MOS transistors Qd11 through Qd15 are used as capacitors, and Qd16 through Qd20 are D type n-channel MOS transistors serving to transfer the electric charges. The gate electrodes of Qd16 through Qd20 are connected to a node N1. The voltage of the node N1 increases due to a voltage converting circuit constituted by E type p-channel MOS transistor Qp7 and E type n-channel MOS transistor Qn24 accompanied by a drop of the supply voltage Vcc. When $V_{cc}$ drops, a gate voltage of transistor Qn24 decreases which therefore decreases a drivability of this transistor. In other words, the resistance of transistor Qn24 is increased when voltage $V_{cc}$ decreases. At the same time, the drivability of the transistor Qp7 remains practically stable, and therefore the voltage at node N1 is increased due to the resistance ratio between the transistors Qn24 and Qp7. $V_{ST}$, which is a source voltage of Qp7, is an output of a constant-voltage circuit which does not depend on the supply voltage Vcc.

When an enable signal $\overline{\phi RON}$ of the ring oscillator becomes "L", the ring oscillator 9 is activated. When the supply voltage Vcc drops, a voltage of the node N1 increases and the electric charge transfer capacity of MOS transistors Qd16 through Qd20 increases, so that the oscillating frequency of the ring oscillator is increased. Timing for output signals $\phi R1$ through $\phi R4$ is controlled by inverters I2 through I9, NOR circuits G1, G4, NAND circuits G2, G3 and delay circuits D1 through D3. The delay circuits D1, D3 generate delay period of $\tau 2$ whereas the delay circuit D2 generates a delay period of $\tau 1$ shown in FIG. 9.

In the embodiment, the gates of MOS transistors Qd16–Qd20, Qd21–Qd25 are shared at the node N1, however, if the gates of MOS transistors Qd16–Qd20, Qd21–Qd25 are controlled by two nodes, the controllability of the transitors is improved.

Figure 11:
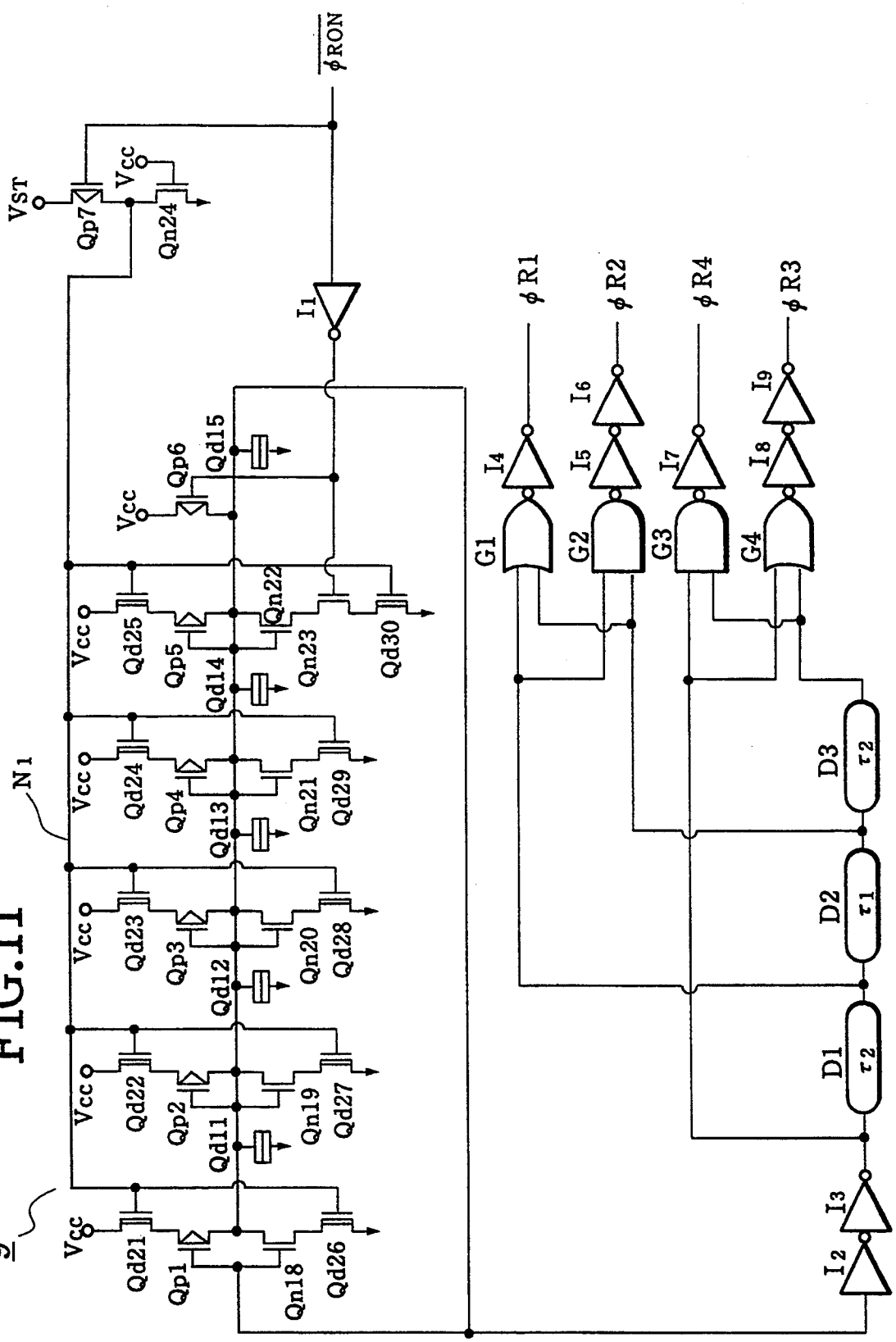
FIG. 11 shows a second structural example of the ring oscillator shown in FIG. 4.

FIG. 11 shows a second structural example of the ring oscillator 9. In this second example, between D type n-channel MOS transistors QD21 through QD25 and QD26 through QD30 serving to transfer the electric charge are connected between each inverter circuit, the supply potential and the ground potential, in place of the D type n-channel MOS transistors QD16 through QD20 shown in FIG. 10. In this second example of the ring oscillator, though there are required two D type n-channel MOS transistors for each inverter circuit thus an area occupied by the circuits is greater compared to the first embodiment shown in FIG. 10, a through current caused by the inverter circuit constituting the ring oscillator is suppressed and prevented from increasing in case of an increase of the supply voltage Vcc.

It is to be noted that when the output $V_{ST}$ of the constant-voltage circuit is set in a range between 0V and the supply voltage Vcc, the relation including a voltage VN1 of the node N1 in terms of voltage level is such that $0 V < VN1 < V_{ST} < Vcc$ in the ring oscillator shown in FIG. 10 and FIG. 11. Then, the threshold voltage of the D type n-channel MOS transistors Qd16 through Qd20, Qd21 through Qd25 and Qd26 through Qd30 serving to transfer the electric charge are set such that when the voltage VN1 is applied to the gate electrode, the supply voltage Vcc applied to the drain is transferred to the source without causing a voltage drop due to the threshold voltage. Even when it is not possible to set the threshold voltage as in above, the supply voltage Vcc applied to the drain must be transferred to the source such that the Vcc exceeds the threshold voltage of the inverter circuit constituting the ring oscillator when the voltage VN1 is applied to the gate electrode. In this case, since an input voltage of the inverter circuit constituting the ring oscillator does not sufficiently arise in the ring oscillator shown in FIG. 10, the through current flows through the inverter circuit so that a power consumed may be increased.

Figure 12A:
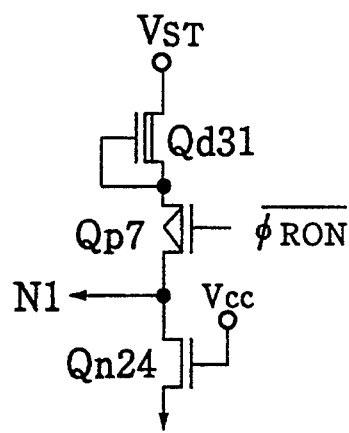
FIG. 12A and FIG. 12B show an example of a voltage converting circuit in the ring oscillator shown in FIG. 10 and FIG. 11.
Figure 12B:
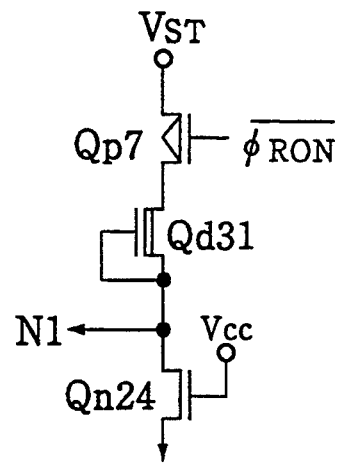
Figure 13:
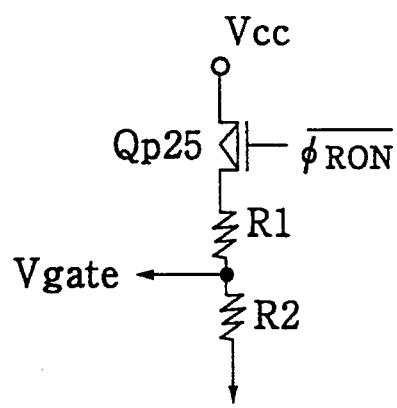
FIG. 13 shows another example of the voltage converting circuit comprising an E type n-channel MOS transitor in the first embodiment for generating a gate voltage.

It shall be appreciated that the voltage converting circuit comprising the E type p-channel MOS transistor Qp7 and the E type n-channel MOS transistor Qn24 shown in FIG. 10 and FIG. 11 may be of a circuit shown in FIG. 12A or FIG. 12B. In other words, a D type n-channel MOS transistor Qd31 connecting a gate and a source may be connected to a side of the E type p-channel MOS transistor Qp7. The circuits shown in FIG. 12A and FIG. 12B have a greater dependency of supply voltage Vcc on the voltage of the node N1. It is to be noted that though in the voltage converting circuits shown in FIG. 10, FIG. 11, FIG. 12A and FIG. 12B the supply voltage Vcc is applied to the gate electrode of the E type n-channel MOS transistor Qn24, the voltage of this gate electrode may be any voltage which is proportional to the supply voltage Vcc such as ($\frac{1}{2}$)Vcc and (2/5)Vcc and so on. Such voltage $V_{GATE}$ (gate voltage of the transistor Qn24) can be generated by a circuit shown in FIG. 13. In the circuit shown in FIG. 13, when a resistor R1 and a resistor R2 are set such that R1 equals to R2 the output $V_{GATE}$ becomes ($\frac{1}{2}$)Vcc. Moreover, the constant-voltage $V_{ST}$ in FIGS. 10 through 12 operates as Vcc by adjusting a supply voltage range in use.

Moreover, it shall be appreciated that the number of steps may be adjusted on demand though there are 5-step ring in FIG. 10 and FIG. 11.

Figure 14:
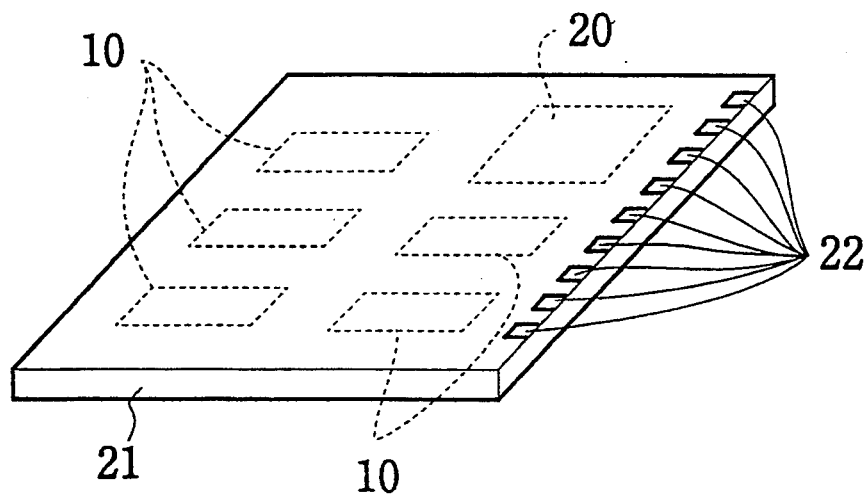
FIG. 14 shows a second embodiment which is adopted for a memory card.
Figure 15:
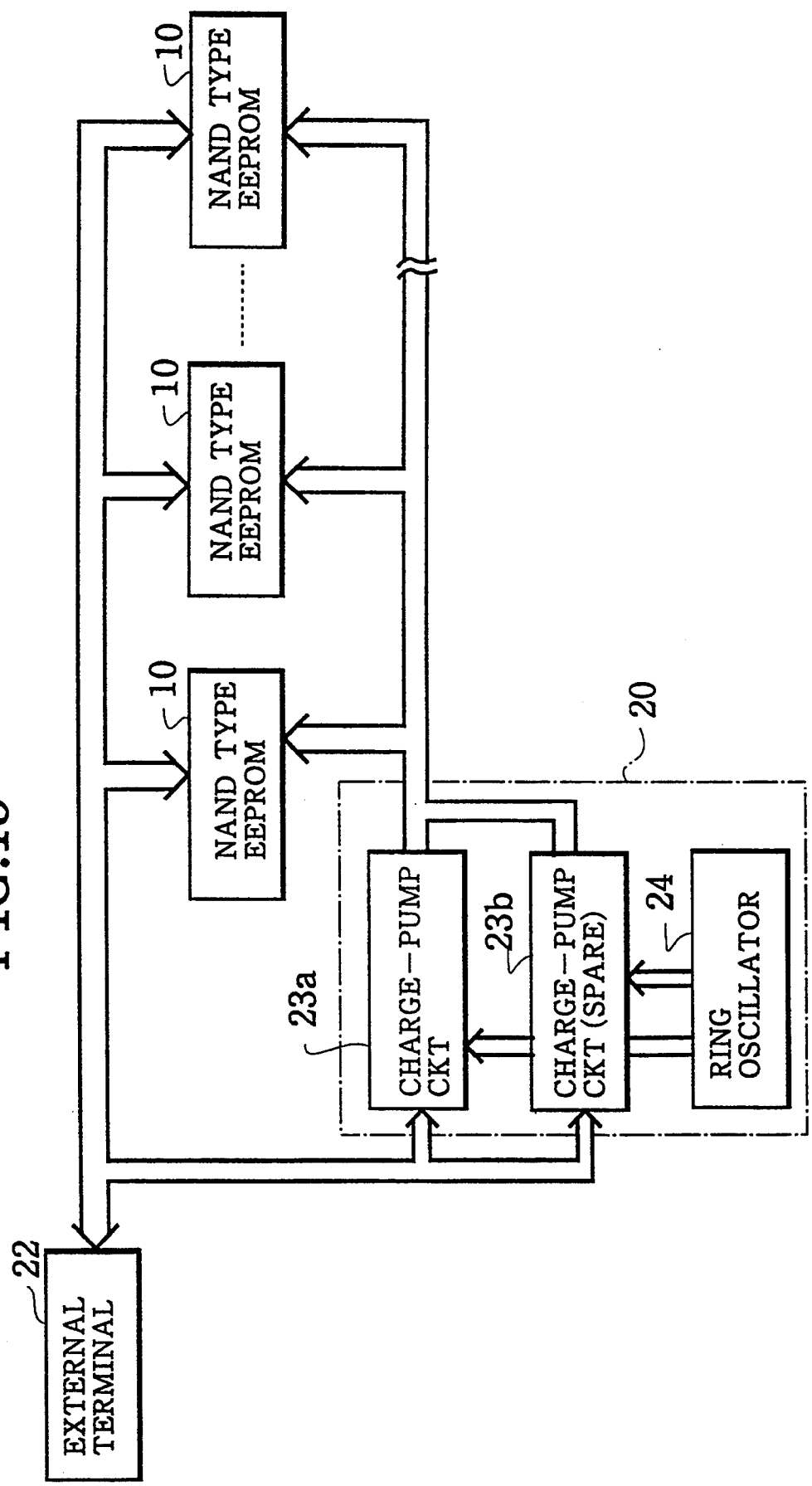
FIG. 15 shows a block diagram of the second embodiment of the present invention for a non-volatile semiconductor memory device utilizing a NAND type EEPROM.

FIG. 14 shows a second embodiment which is adopted for a memory card. In the same figure, there are provided a plurality of memory systems 10 (in this example there are five memory systems 10) and a commonly shared charge-pump unit 20 having a built-in charge pump circuit 8 and ring oscillator 9, on a same substrate 21. The reference numeral 22 designates an external terminal. In the memory system 10 there are built-in therein a memory cell array and so on where the NAND cells are arranged in matrix as described in the first embodiment. In the charge-pump circuit 20, with reference to FIG. 15 there are provided a positive charge-pump circuit 23a, a spare charge-pump circuit 23b and a ring oscillator 24 driving the charge-pump circuits 23a, 23b in order to improve a reliability thereof. The spare charge-pump circuit 23b is designed to continue the charge pumping operations of charge pump circuit 23a in the event that charge pump circuit 23a fails to operate. In the memory card according to the second embodiment, since there is provided a commonly shared charge-pump circuit 20 for the plurality of memory systems 10 which do not have a charge-pump circuit and a ring oscillator, the memory card can be made with a compact size and economically.

Figure 16:
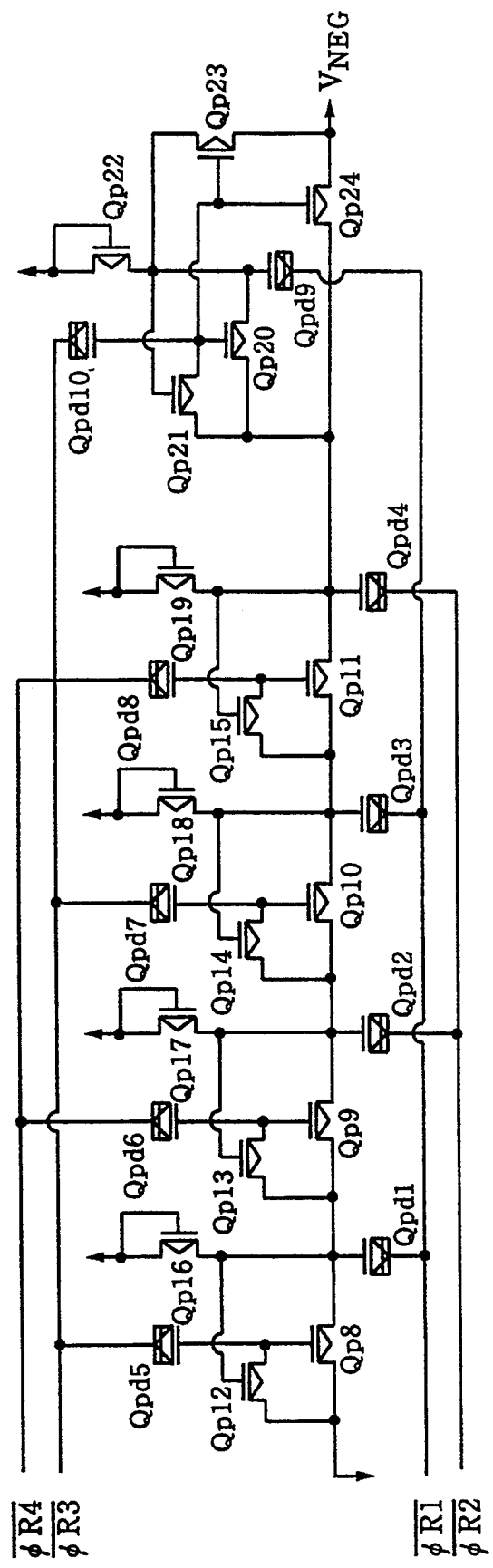
FIG. 16 shows a negative charge-pump circuit according to the second embodiment.
Figure 17:
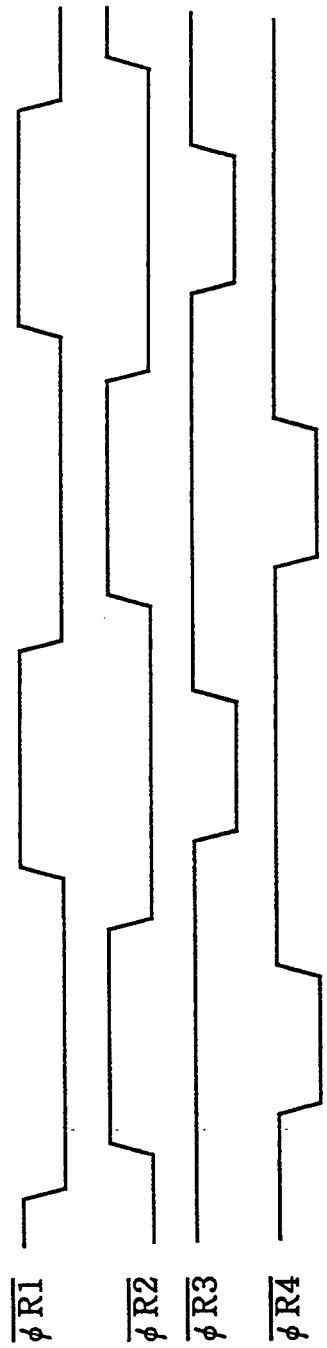
FIG. 17 shows a timing chart to show drive signals in a negative charge-pump circuit shown in FIG. 15.

When the memory system 10 requires a positive high voltage and also a negative voltage for reprogramming, it suffices to provide a negative charge-pump circuit 30 shown in FIG. 16 together with a positive charge-pump circuit. Then, the drive signals shall be $\overline{\phi R1}$, $\overline{\phi R2}$, $\overline{\phi R3}$ and $\overline{\phi R4}$ which are inverted signals for $\phi R1$, $\phi R2$, $\phi R3$ and $\phi R4$ shown in FIG. 9, respectively. In FIG. 16, Qp8 through Qp24 are E type p-channel MOS transistors, whereas Qpd1 through Qpd10 are D type p-channel MOS transistors. It shall be appreciated that a p type well and a wiring material on the p type well may constitute a capacitor and drive signals $\overline{\phi R1}$ through $\overline{\phi R4}$ may be given to the p type well, in place of the D type p-channel MOS transistors Qpd1 through Qpd10.

It shall be appreciated that the number of step may be adjusted on demand though there are four steps charge-pumps in this embodiment.

The present invention may be adapted to a NOR type EEPROM and other devices which requires charge-pumping.

In summary, according to the present invention, firstly, there are provided an oscillating circuit in which an oscillating frequency increases as the supply voltage drops, and a charge-pump circuit in which a driving frequency depends on the charge-pump capacity for write/erase operation. Therefore, the charge-pump circuit which has a current supply capability without depending on the supply voltage is realized and there will not be a waste of power accompanied with the fluctuation of the supply voltage at the time of write/erase.

Secondly, a plurality of inverter circuits serving as oscillating circuits are circularly connected via MOS transistors for transferring the electric charge and a ring oscillator is utilized in which the gate electrodes of the MOS transistors are driven by the voltage converting circuit in which the output voltage changes in a direction such that the transfer capacity of MOS transistors is increased upon a drop of the supply voltage. Thus, there is realized an optimum oscillating circuit as a non-volatile semiconductor memory device.

Thirdly, the plurality of inverter circuits constituting the ring oscillator are each connected to the supply potential and the ground potential via electric-charge-transfer MOS transistors, so that the through currents of the inverter circuits are suppressed and prevented from increasing as the supply voltage rises.

Fourthly, since there is provided a commonly shared charge-pump device for a plurality of memory systems, thus realizing a compact-sized and economical non-volatile semiconductor memory device which serves optimally as a memory card and so on.

Besides those already mentioned above, many modifications and variations of the above embodiments may be made without departing from the novel and advantageous features of the present invention. Accordingly, all such modifications and variations are intended to be included within the scope of the appended claims.

What is claimed is:

1. An electrically programmable non-volatile semiconductor memory device operated by a power supply voltage, said memory device comprising:
   a memory system equipped with memory means having a non-volatile memory function;
   an oscillating circuit for generating a signal having a frequency which is continuously increased in response to a decrease of said power supply voltage; and
   a charge-pump circuit for generating a voltage required to write data into or erase data from said memory means by charge-pumping said power supply voltage in accordance with said signal generated by said oscillating circuit.

2. A memory device according to claim 1, wherein said oscillating circuit comprises a ring oscillator which is comprised of a plurality of inverter circuits circularly connected to one another via a first MOS transistor which serves to transfer an electric charge, a gate electrode of said first MOS transistor being connected to an output terminal of a voltage converting circuit which increases a transfer capacity of said first MOS transistor as said power supply voltage decreases.

3. A memory device according to claim 1, wherein a ring oscillator is employed as said oscillating circuit, said ring oscillator comprising a plurality of inverter circuits which are circularly connected to one another, each of said plurality of inverter circuits being further connected to a power supply potential and to an electrical ground potential via a first MOS transistor which serves to transfer an electric charge, a gate electrode of said first MOS transistor being connected to an output terminal of a voltage converting circuit which increases a transfer capacity of said first MOS transistor as said power supply voltage decreases.

4. A memory device according to claim 1, wherein said memory system and said charge-pump circuit are employed on a memory card.

5. A memory device according to any of claims 2 or 3, wherein said first MOS transistor comprises an n-channel MOS transistor and said voltage converting circuit comprises a resistive element and a second n-channel MOS transistor which serves to shift a voltage level between an output level of a constant-voltage circuit and an electrical ground potential, said output terminal of said voltage converting circuit being a connecting point of said resistive element and said second n-channel MOS transistor, and said power supply voltage or a voltage proportional to said power supply voltage being applied to a gate electrode of said second n-channel MOS transistor.

6. A non-volatile semiconductor memory device comprising:
- a plurality of memory systems each equipped with memory means having a non-volatile memory function;
- a first high-voltage generating circuit, commonly connected to each of said plurality of memory systems, for generating a high voltage required to write data into or erase data from each of said memory means by transforming a power supply voltage; and
- a second high-voltage generating circuit for continuing an operation of said first high-voltage generating circuit in the event that said first high-voltage generating circuit fails to operate.

7. A memory device according to claim 6, further comprising an oscillating circuit for generating a signal having a frequency which is continuously increased in response to a required decrease of said power supply voltage.

8. A memory device according to claim 6, wherein said plurality of memory systems and said first high-voltage generating circuit are employed on a memory card.

9. A memory device according to claim 7, wherein said oscillating circuit comprises a ring oscillator which is comprised of a plurality of inverter circuits circularly connected to one another via a first MOS transistor which serves to transfer an electric charge, a gate electrode of said first MOS transistor being connected to an output terminal of a voltage converting circuit which increases a transfer capacity of said first MOS transistor as said power supply voltage decreases.

10. A memory device according to claim 7, wherein a ring oscillator is employed as said oscillating circuit, said ring oscillator comprising a plurality of inverter circuits which are circularly connected to one another, each of said plurality of inverter circuits being further connected to a power supply potential and to an electrical ground potential via a first MOS transistor which serves to transfer an electric charge, a gate electrode of said first MOS transistor being connected to an output terminal of a voltage converting circuit which increases a transfer capacity of said first MOS transistor as said power supply voltage decreases.

11. A memory device according to any of claims 9 or 10, wherein said first MOS transistor comprises an n-channel MOS transistor and said voltage converting circuit comprises a resistive element and a second n-channel MOS transistor which serves to shift a voltage level between an output level of a constant-voltage circuit and an electrical ground potential, said output terminal of said voltage converting circuit being a connecting point of said resistive element and said second n-channel MOS transistor, and said power supply voltage or a voltage proportional to said power supply voltage being applied to a gate electrode of said second n-channel MOS transistor.

12. A semiconductor device comprising:
- an oscillating circuit for generating a signal having a frequency which is continuously increased in response to a decrease in a power supply voltage; and
- a charge-pump circuit for generating a voltage required to write data into or erase data from memory means by charge-pumping said power supply voltage in accordance with said signal generated by said oscillating circuit, wherein said semiconductor device is characterized in that a plurality of inverter circuits are circularly connected to one another via a first MOS transistor which serves to transfer to an electric charge, a gate electrode of said first MOS transistor being connected to an output terminal of a voltage converting circuit which increases a transfer capacity of said first MOS transistor as said power supply voltage decreases.

13. A memory device according to claim 6, wherein said first high voltage generating circuit comprises memory card means commonly connected to each of said plurality of memory systems, for generating a high voltage required to write data into or erase data from each of said memory means by transforming a power supply voltage.

* * * * *

UNITED STATES PATENT AND TRADEMARK OFFICE
CERTIFICATE OF CORRECTION

PATENT NO. : 5,394,372
DATED : February 28, 1995
INVENTOR(S) : Tomoharu TANAKA, et al.

It is certified that error appears in the above-indentified patent and that said Letters Patent is hereby corrected as shown below:

On the title page, Item [30], the Foreign Application Priority Number is listed incorrectly. It should read:

--4-126002--

Signed and Sealed this

Twenty-third Day of May, 1995

Attest:

BRUCE LEHMAN

*Attesting Officer*  *Commissioner of Patents and Trademarks*